(12) United States Patent
Tsai et al.

(10) Patent No.: US 8,785,286 B2
(45) Date of Patent: Jul. 22, 2014

(54) TECHNIQUES FOR FINFET DOPING

(75) Inventors: Chun Hsiung Tsai, Xinpu Township (TW); Chien-Tai Chan, Hsin-Chu (TW); Mao-Rong Yeh, Tao Yuan (TW); Da-Wen Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 880 days.

(21) Appl. No.: 12/702,803

(22) Filed: Feb. 9, 2010

(65) Prior Publication Data

US 2011/0195555 A1    Aug. 11, 2011

(51) Int. Cl.
*H01L 21/336* (2006.01)
*H01L 21/26* (2006.01)
*H01L 21/42* (2006.01)
*H01L 21/223* (2006.01)

(52) U.S. Cl.
USPC ............... 438/301; 438/513; 257/E21.143; 257/E21.435

(58) Field of Classification Search
USPC .................................. 438/301, 513
See application file for complete search history.

(56) References Cited

U.S. PATENT DOCUMENTS

| | | | |
|---|---|---|---|
| 5,648,673 A * | 7/1997 | Yasuda | .......................... 257/382 |
| 5,844,278 A | 12/1998 | Mizuno et al. | |
| 6,238,537 B1 | 5/2001 | Kahn et al. | |
| 6,706,571 B1 | 3/2004 | Yu et al. | |
| 6,858,478 B2 | 2/2005 | Chau et al. | |
| 7,190,050 B2 | 3/2007 | King et al. | |
| 7,247,887 B2 | 7/2007 | King et al. | |
| 7,265,008 B2 | 9/2007 | King et al. | |
| 7,508,031 B2 | 3/2009 | Liu et al. | |
| 7,528,465 B2 | 5/2009 | King et al. | |
| 7,605,449 B2 | 10/2009 | Liu et al. | |
| 2005/0153490 A1 | 7/2005 | Yoon et al. | |
| 2007/0026615 A1 * | 2/2007 | Goktepeli et al. | ............ 438/281 |
| 2007/0084564 A1 * | 4/2007 | Gupta et al. | ............ 156/345.48 |
| 2007/0120156 A1 | 5/2007 | Liu et al. | |
| 2007/0122953 A1 | 5/2007 | Liu et al. | |
| 2007/0122954 A1 | 5/2007 | Liu et al. | |
| 2007/0128782 A1 | 6/2007 | Liu et al. | |
| 2007/0132053 A1 | 6/2007 | King et al. | |
| 2008/0290470 A1 | 11/2008 | King et al. | |
| 2008/0296632 A1 | 12/2008 | Moroz et al. | |
| 2009/0181477 A1 | 7/2009 | King et al. | |

FOREIGN PATENT DOCUMENTS

JP            04245643 A  *  9/1992

* cited by examiner

*Primary Examiner* — Calvin Choi
(74) *Attorney, Agent, or Firm* — Slater and Matsil, L.L.P.

(57) ABSTRACT

A method of forming an integrated circuit includes providing a semiconductor wafer including a semiconductor fin dispatched on a surface of the semiconductor wafer; forming a dopant-rich layer having an impurity on a top surface and sidewalls of the semiconductor fin, wherein the impurity is of n-type or p-type; performing a knock-on implantation to drive the impurity into the semiconductor fin; and removing the dopant-rich layer.

18 Claims, 7 Drawing Sheets

US 8,785,286 B2

TECHNIQUES FOR FINFET DOPING

TECHNICAL FIELD

This disclosure relates generally to integrated circuit devices, and more particularly to methods for manufacturing fin field-effect transistors (FinFETs).

BACKGROUND

Transistors are core devices of integrated circuits. The formation of transistors typically involves implanting impurities into semiconductor substrates to form source and drain regions and lightly doped source and drain (LDD) regions. The implanted source and drain regions and LDD regions are then annealed so that the implanted impurities are activated and the defects caused by the implantation are reduced.

Conventionally, LDD regions of fin field-effect transistors (FinFETs) were formed by implanting impurities into portions of fins. FIG. 1 illustrates a cross-sectional view of a conventional LDD implantation process, wherein arrows represent the implanted impurity. In order to form LDD regions on the sidewalls of fin 10, the implantations are tilted with tilt angles θ greater than 0 degrees.

Since the circuits are highly compacted, there are other devices in the close proximity of fin 10. For example, fin 12 may be closely located from fin 10. Fins 10 and 12 may belong to FinFETs having different conductivity types. Therefore, when fin 10 is implanted, photo resist 14 is formed to mask fin 12. Since height H of photo resist 14 is typically much greater compared to height h of fin 10, the shadowing effect may occur, and photo resist 14 may block some of the impurity ions from reaching the lower portions of fin 10 if tilt angle θ is greater than a certain value (the illustrated angle θ in FIG. 1). On the other hand, the shadowing effect cannot be eliminated by reducing tilt angles θ since the reduction of tilt angles θ results in the reduction in the implantation depth, and the resulting LDD regions will become too shallow.

LDD regions may also be formed by depositing a boron silicate glass (BSG) layer or a phospho silicate glass (PSG) layer on a fin through a chemical vapor deposition step, and then performing an anneal so that the boron atoms in the BSG layer or the phosphorous atoms in the PSG layer may diffuse into the fin to form LDD regions. However, the anneal temperature needs to be higher than about 500° C., which is higher than the maximum temperature any photo resist can sustain. Accordingly, this process is incompatible with the use of photo resist.

SUMMARY

In accordance with one aspect, a method of forming an integrated circuit includes providing a semiconductor wafer including a semiconductor fin dispatched on a surface of the semiconductor wafer; forming a dopant-rich layer having an impurity on a top surface and sidewalls of the semiconductor fin, wherein the impurity is of n-type or p-type; performing a knock-on implantation to drive the impurity into the semiconductor fin; and removing the dopant-rich layer.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative and do not limit the scope of the disclosure.

A novel method for forming fin field-effect transistors (FinFETs) is presented. The intermediate stages of manufacturing the embodiment are illustrated. The variations of the embodiment are discussed. Throughout the various views and illustrative embodiments, like reference numbers are used to designate like elements.

Figure 2:
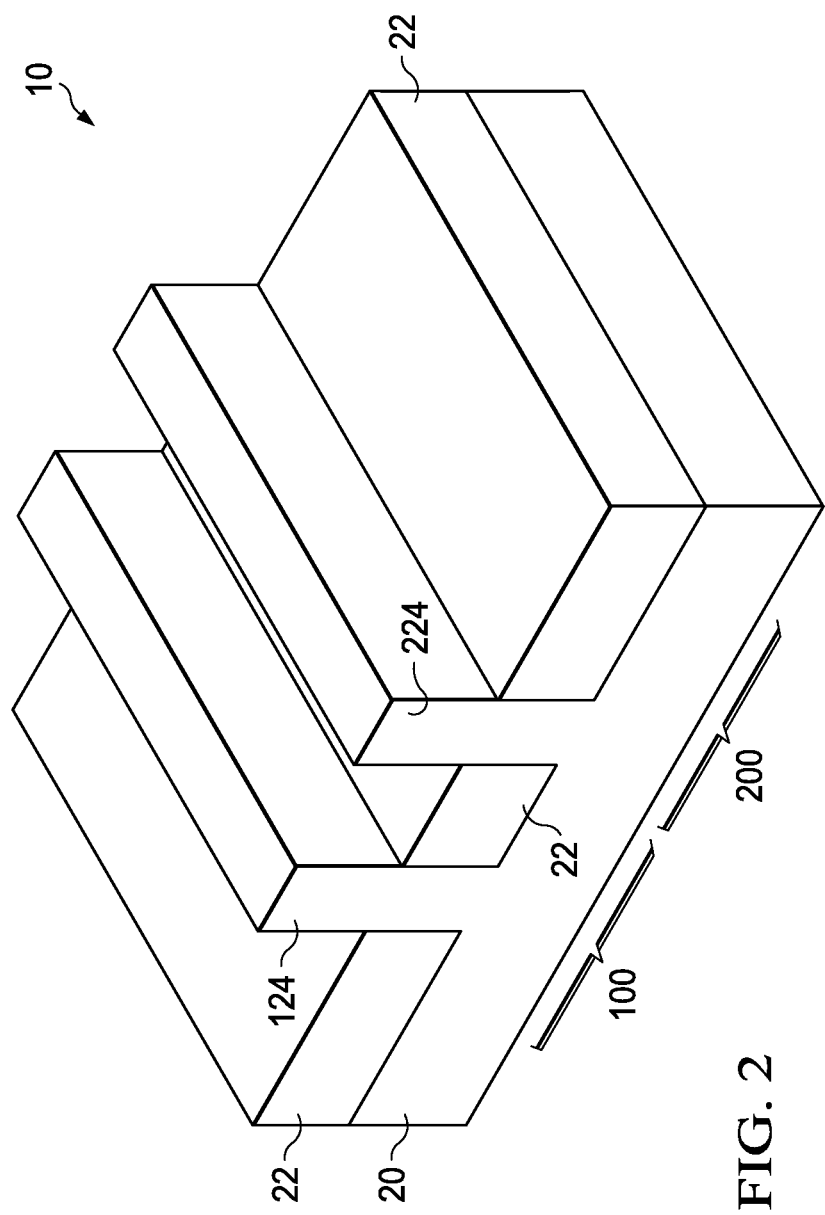

Referring to FIG. 2, an integrated circuit structure is formed. The illustrated integrated circuit structure includes a part of wafer 10, which further includes substrate 20. Substrate 20 may be a silicon substrate, a germanium substrate, or a substrate formed of other semiconductor materials. Substrate 20 may be doped with a p-type or an n-type impurity. Isolation regions, such as shallow trench isolation (STI) regions 22, may be formed in or over substrate 20. Semiconductor fins 124 and 224 are formed above the top surfaces of STI regions 22. Substrate 20 includes a portion in first device region 100 and a portion in second device region 200, and semiconductor fins 124 and 224 are in first device region 100 and second device region 200, respectively. In an embodiment, first device region 100 and second device region 200 are used to form one n-type FinFET and one p-type FinFET.

Figure 3:
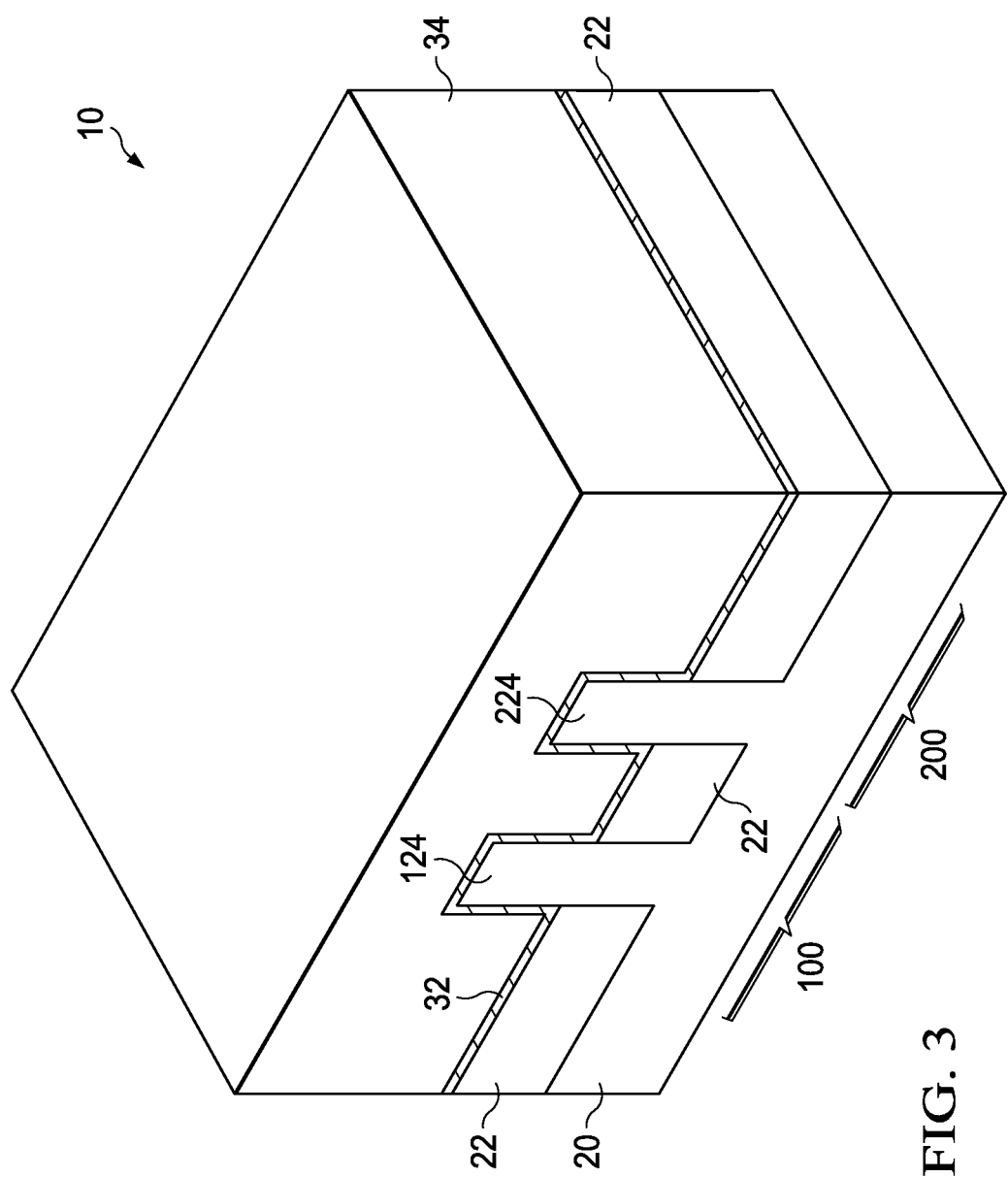

Referring to FIG. 3, gate dielectric layer 32 and gate electrode layer 34 are deposited in both first device region 100 and second device region 200 and over semiconductor fins 124 and 224. In an embodiment, gate dielectric layer 32 is formed of a high-k dielectric material. The exemplary high-k materials may have k values greater than about 4.0, or even greater than about 7.0, and may include aluminum-containing dielectrics, such as $Al_2O_3$, HfAlO, HfAlON, AlZrO, Hf-containing materials, such as $HfO_2$, $HfSiO_x$, $HfAlO_x$, $HfZrSiO_x$, HfSiON, and/or other materials, such as $LaAlO_3$ and $ZrO_2$. Gate electrode layer 34 is formed on gate dielectric layer 32, and may be formed of a conductive material, such as doped polysilicon, metals, metal nitrides, or the like.

Figure 4:
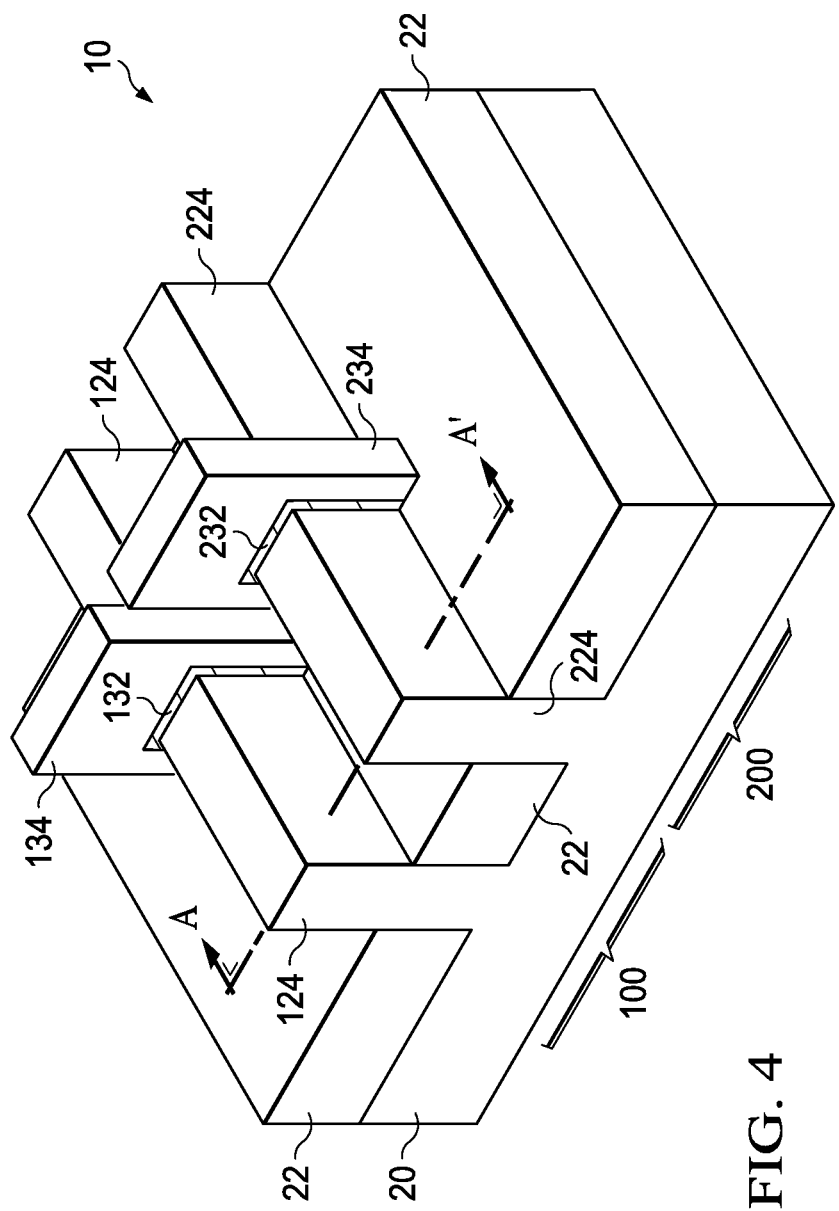

Gate electrode layer 34 and gate dielectric layer 32 are then patterned to form gate stacks, as is shown in FIG. 4. The gate stack in first device region 100 includes gate electrode 134 and gate dielectric 132. The gate stack in second device region 200 includes gate electrode 234 and gate dielectric 232. Each of semiconductor fins 124 and 224 thus has portions that are uncovered by the gate stacks. The exposed portions of semiconductor fins 124 and 224 may be left as they are so that subsequent pocket and lightly doped source and drain (LDD) regions may be formed by implantation. Alternatively, the exposed portions of semiconductor fins 124 and 224 may be removed to form recesses and semiconductor stressors may be epitaxially re-grown in the resulting recesses. In an exemplary embodiment, the semiconductor stressors in first device region 100 may comprise silicon carbon (SiC), while the semiconductor stressors in second device region 200 may comprise silicon germanium (SiGe).

Figure 1:
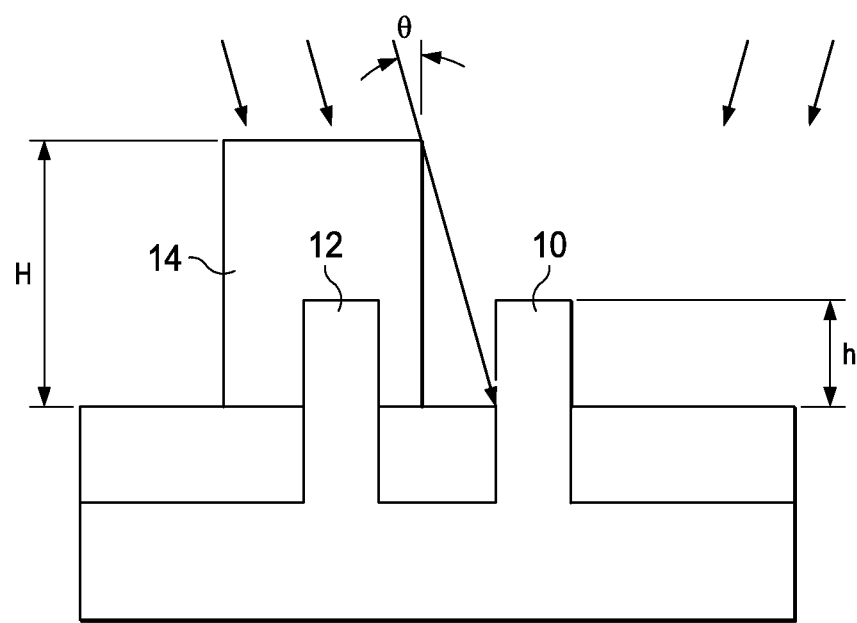
FIG. 1 illustrates a cross-sectional view of a conventional process for forming a lightly-doped source/drain region of a first fin field-effect transistor (FinFET)
Figure 5:
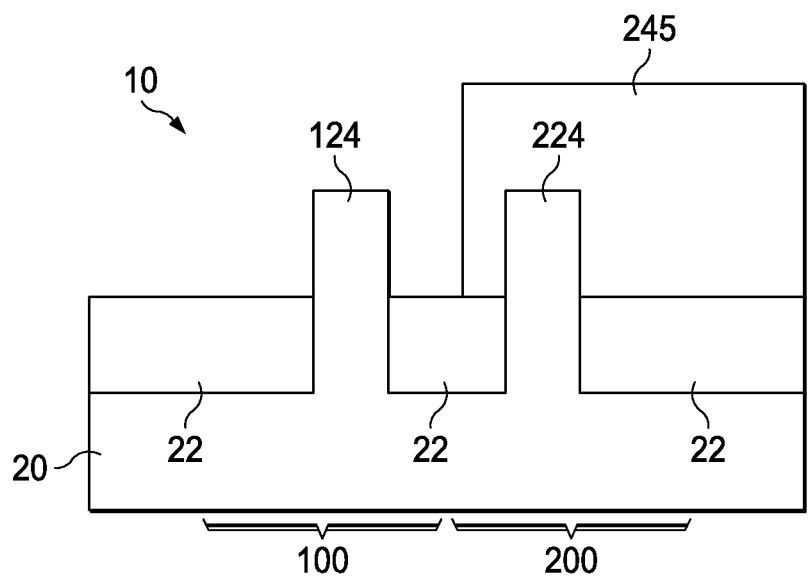
FIGS. 2 through 8 are cross-sectional views of intermediate stages in the manufacturing of FinFETs in accordance with an embodiment.

Referring to FIG. 5, photo resist 245 is formed and patterned to cover second device region 200, while leaving first device region 100 uncovered. FIG. 5 is a cross-sectional view obtained from the vertical plane crossing line A-A' in FIG. 4. Accordingly, the gate stacks are not shown.

Figure 6:
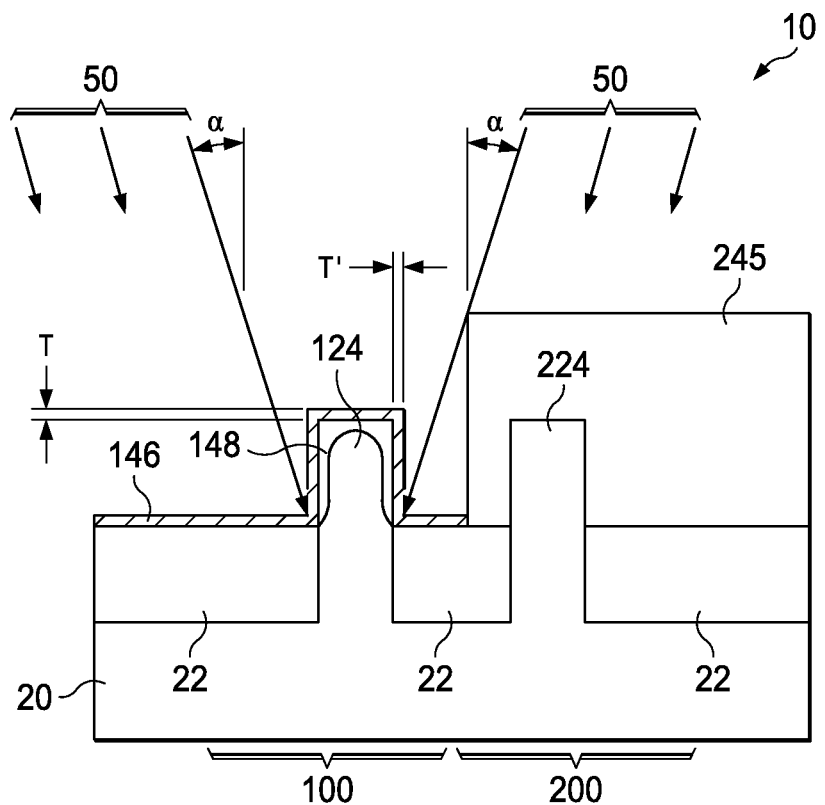
Figure 9:
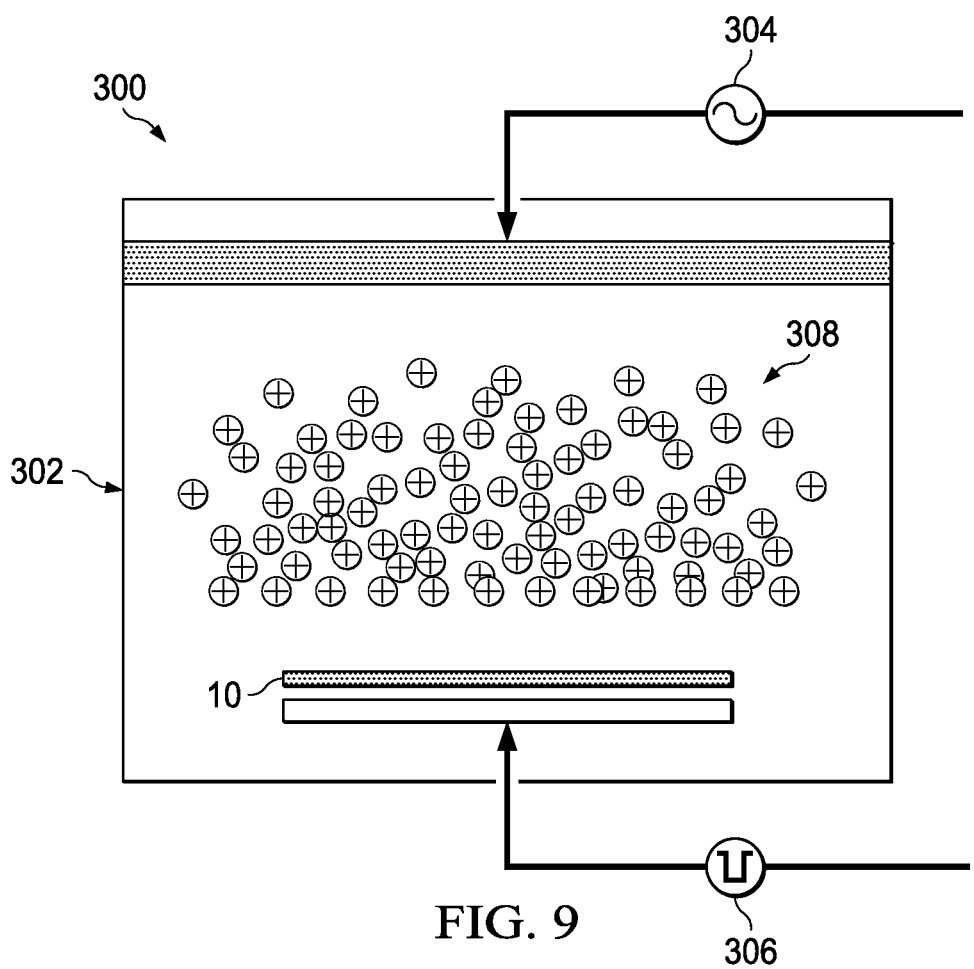
FIG. 9 illustrates an apparatus for performing a plasma ion assisted deposition.

Referring to FIG. 6, wafer 10 is placed into apparatus 300 as shown in FIG. 9, which is used for performing a plasma ion assisted deposition (PIAD). Apparatus 300 includes chamber 302, in which wafer 10 is placed, and power sources 304 and 306 connected into chamber 302. Power source 304 may be a radio frequency (RF) power source with programmable pulse modulation function, while power source 306 may be a DC power source for providing a DC bias voltage.

Power sources 304 and 306 may be operated independently from each other. Each of power sources 304 and 306 may be programmed to be independently powered on and off without affecting the other. Using production tool 300 as illustrated in FIG. 9, dopant-rich layer 146 is formed on fin 124, as is shown in FIG. 6. Dopant-rich layer 146 comprises the impurity that is used for forming the desirable LDD regions in fin 124. Depending on the desirable conductivity type of the resulting FinFET, dopant-rich layer 146 may be formed of an n-type impurity (impurities) or a p-type impurity (impurities). For example, if the resulting FinFET is a p-type FinFET, dopant-rich layer 146 may comprise boron and/or In, while if the resulting FinFET is an n-type FinFET, dopant-rich layer 146 may comprise phosphorous and/or arsenic. In an exemplary embodiment, the atomic percentage of the desirable impurity in dopant-rich layer 146 may be greater than about 80 percent, 90 percent, 95 percent, or even 99 percent, and may actually be a pure impurity layer.

The process gases in chamber 302 (refer to FIG. 9) may include $AsH_3$, $B_2H_6$, $PH_3$, $BF_3$, dilution gas, such as Xe, Ar, He, Ne, and/or the like, depending on the desirable composition of dopant-rich layer 146. RF power source 304 (FIG. 9) is turned on to generate plasma 308. The power of RF power source 304 may be between about 50 watts and about 1,000 watts, for example, although a greater or a smaller power may also be used. In an embodiment, RF power source 304 is turned on continuously during the entire period for forming dopant-rich layer 146. In an alternative embodiment, RF power source 304 is pulsed (in an on and off pattern) in order to improve the conformity (the step coverage) of dopant-rich layer 146, wherein the conformity of dopant-rich layer 146 may be represented using ratio T'/T as shown in FIG. 6, with thickness T' being the thickness of the sidewall portions of dopant-rich layer 146, with thickness T being the thickness of the top portion of dopant-rich layer 146. In an exemplary embodiment, by carefully tuning the process conditions, the conformity (ratio T'/T) may be greater than about 50 percent.

Figure 10:
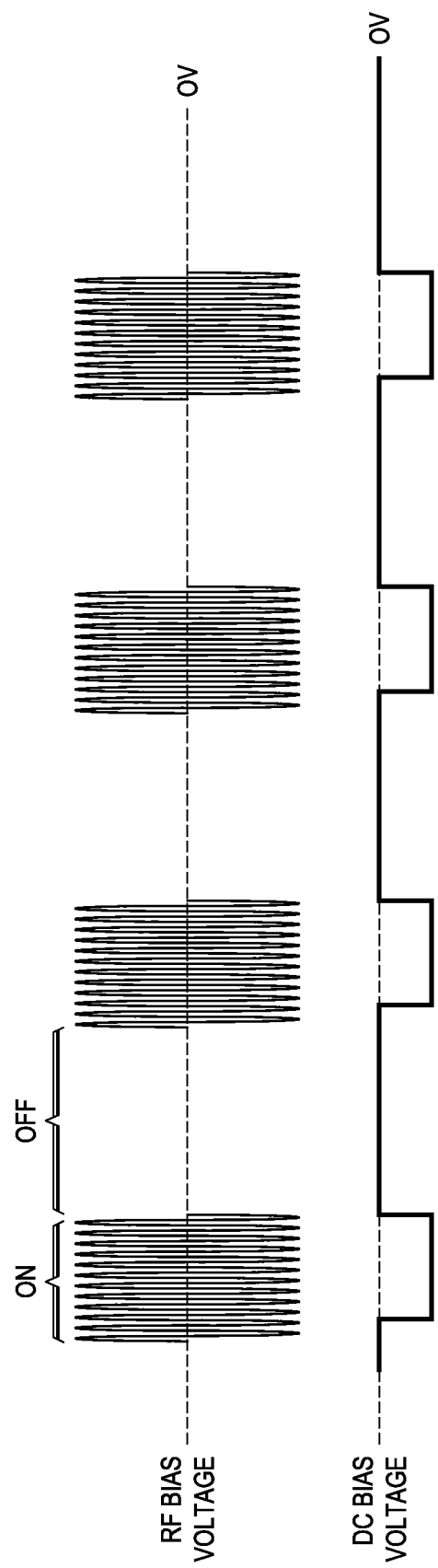
FIG. 10 shows schematic DC and RF bias voltages applied during the plasma ion assisted deposition of a dopant layer.

During the formation of dopant-rich layer 146, DC power source 306 as in FIG. 9 is either turned off, or has a low bias voltage lower than about 1.5 kV so that there is no unwanted amorphization layer formation during the dopant layer formation. In an exemplary embodiment, the bias voltage output of DC power source 306 is between about 0 kV and about 1.5 kV. With the low or even zero DC bias voltage, the directionality of the formation process is reduced, and hence dopant-rich layer 146 may be deposited over fin 124 as a separate layer, rather being implanted into fin 124. The DC bias voltage provided by DC power source 306 during the formation of dopant-rich layer 146 may also be pulsed (turned on and off), as is schematically illustrated in FIG. 10.

Next, as also shown in FIG. 6, a knock-on implantation is performed to knock the dopants in dopant-rich layer 146 into fin 124, so that LDD region 148 is formed. As shown by arrows 50, the knock-on implantation may be performed with tilt angle α. Further, tilt angle α may be calculated based on the height of photo resist 245 and the distance between photo resist 245 and fin 124, so that the knock-on implantation is not shadowed by photo resist 245. In other words, the implanted ions may reach the bottom portions of dopant-rich layer 146 without being blocked. In an exemplary embodiment, tilt angle α is greater than 0 degrees and less than about 45 degrees. The ions used in the knock-on implantation may comprise carbon, germanium, argon, nitrogen, and/or other elements that do not adversely affect the characteristics of the resulting FinFET.

Figure 7:
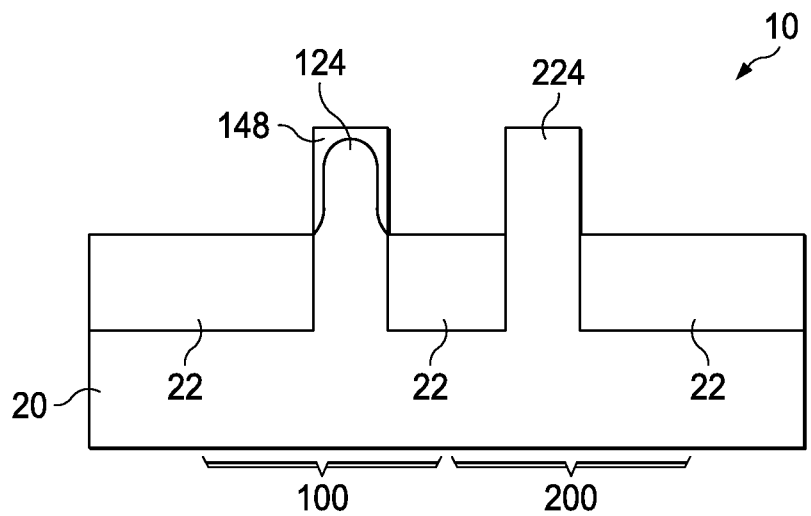
Figure 8:
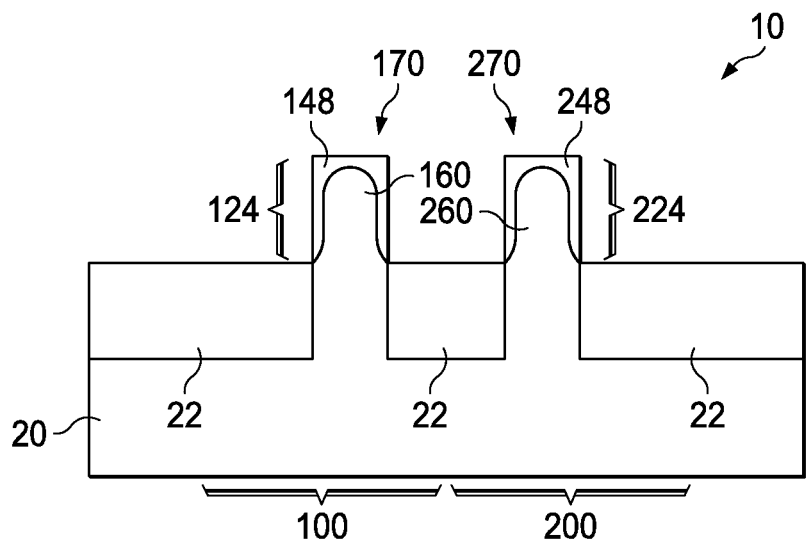

Referring to FIG. 7, after the knock-on implantation, the remaining portions of dopant-rich layer 146 are removed, for example, by using a wet dip. Photo resist 245 is also removed. In subsequent process steps, as shown in FIG. 8, an additional LDD region 248 may be formed in fin 224 using essentially the same process (including PIAD and knock-on implantation processes) as discussed, except fin 124 is covered by a photo resist during the formation of LDD region 248, and fin 224 may have an opposite conductivity type than fin 124. One skilled in the art will realize the process details by applying the preceding teaching. After the removal of photo resist 245, an LDD anneal is performed to activate the impurities. The LDD anneal may be performed at a wafer temperature between about 900° C. and about 1100° C., for example. The LDD anneal may be a millisecond anneal (MSA) or a rapid thermal anneal (RTA).

After the formation of LDD regions 148 and 248, gate spacers (not shown) may be formed. In subsequent process steps, n-type impurities (such as phosphorous) and p-type impurities (such as boron) may be implanted into fins 124 and 224, depending on the desirable conductivity types, to form deep source and drain regions (not shown). The impurity concentration in deep source/drain regions 160 and 260 may be between about $3 \times 10^{20}/cm^3$ and about $1 \times 10^{21}/cm^3$, for example. FinFETs 170 and 270 are thus formed.

In alternative embodiments, after the formation of dopant-rich layer 146, as shown in FIG. 6, no knock-on implantation is performed. Instead, the impurity in dopant-rich layer 146 is diffused into fin 124 by an anneal. The anneal process may be performed after the removal of photo resist 245, so that the anneal process may be performed for a long duration (for example, between about 1 second and about 50 seconds), and at a high temperature, for example, higher than about 900° C. Alternatively, photo resist 245 (FIG. 6) may be replaced by a hard mask that may endure the high temperature of the anneal process. In an embodiment, the hard mask may be formed of silicon nitride, silicon oxy-nitride, or the like. Accordingly, the anneal may be performed before the removal of the hard mask. The remaining process of this embodiment may be essentially the same as illustrated in FIGS. 2-8 and hence is not repeated herein.

In the embodiments, by performing the PIAD and then the knock-on implantation, the impurities of the LDD regions may reach desirable depths without the concern of the shadowing effect. Simulation results have revealed that the change in the depths of LDD regions is not sensitive to the change of the tilt angles of knock-on implantation. Therefore, through the knock-on implantation, although the tilt angle of the knock-on implantation is small in order to achieve no-shadowing implantation, the depths of the LDD regions are still satisfactory, even if no excess implantation energy is used.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method of forming an integrated circuit, the method comprising:
   providing a semiconductor wafer comprising a semiconductor fin dispatched on a surface of the semiconductor wafer;
   forming a dopant-rich layer comprising an impurity on a top surface and sidewalls of the semiconductor fin, wherein the dopant-rich layer is a substantially pure layer comprising substantially pure n-type or p-type impurity;
   performing a knock-on implantation to drive the impurity into the semiconductor fin, wherein the knock-on implantation is performed using carbon, germanium, argon, or nitrogen to drive the impurity into the semiconductor fin; and
   removing the dopant-rich layer substantially completely.

2. The method of claim 1, wherein the dopant-rich layer is substantially free from elements other than the n-type or p-type impurity.

3. The method of claim 1, wherein the knock-on implantation is a tilt implantation.

4. The method of claim 1 further comprising, before the step of forming the dopant-rich layer, forming a gate dielectric and a gate electrode on the semiconductor fin.

5. The method of claim 1, wherein the step of performing the knock-on implantation forms a lightly-doped source/drain (LDD) region of a fin field-effect transistor (FinFET) in the semiconductor fin.

6. The method of claim 1 further comprising:
   before the step of forming the dopant-rich layer, forming a photo resist covering a portion of the semiconductor wafer, wherein a portion of the semiconductor fin for forming the dopant rich layer thereon is not covered; and
   after the step of performing the knock-on implantation, removing the photo resist.

7. The method of claim 1, wherein the step of forming the dopant-rich layer comprises a plasma ion assisted deposition.

8. The method of claim 7, wherein a DC bias power for performing the plasma ion assisted deposition is lower than about 1.5 kV.

9. The method of claim 7, wherein during the plasma ion assisted deposition, no DC bias voltage is applied.

10. The method of claim 1, wherein after the step of removing the dopant-rich layer, an entirety of the dopant-rich layer is removed.

11. A method of forming an integrated circuit, the method comprising:
    providing a semiconductor wafer comprising a semiconductor fin dispatched on a surface of the semiconductor wafer;
    forming a dopant-rich layer comprising an impurity on a top surface and sidewalls of the semiconductor fin, wherein the impurity is of n-type or p-type;
    performing a knock-on implantation to drive the impurity into the semiconductor fin, wherein the knock-on implantation forms a lightly-doped source/drain (LDD) region of a fin field-effect transistor (FinFET) in the semiconductor fin, wherein the knock-on implantation is performed using carbon, germanium, argon, or nitrogen to drive the impurity into the semiconductor fin; and
    removing the dopant-rich layer substantially completely.

12. The method of claim 11, wherein the dopant-rich layer comprises a substantially pure n-type or p-type impurity.

13. The method of claim 11 further comprising, before the step of forming the dopant-rich layer, forming a gate dielectric and a gate electrode on the semiconductor fin.

14. The method of claim 11 further comprising:
    before the step of forming the dopant-rich layer, forming a photo resist covering a portion of the semiconductor wafer, wherein a portion of the semiconductor fin for forming the dopant rich layer thereon is not covered; and
    after the step of performing the knock-on implantation, removing the photo resist.

15. The method of claim 11, wherein the step of forming the dopant-rich layer comprises a plasma ion assisted deposition.

16. A method of forming an integrated circuit, the method comprising:
    providing a semiconductor wafer comprising a semiconductor fin dispatched on a surface of the semiconductor wafer;
    foaming a dopant-rich layer comprising an impurity on a top surface and sidewalls of the semiconductor fin, wherein the impurity is of n-type or p-type;
    performing a knock-on implantation to drive the impurity into the semiconductor fin, wherein the knock-on implantation is performed using carbon, germanium, argon, or nitrogen to drive the impurity into the semiconductor fin; and
    removing the dopant-rich layer substantially completely.

17. The method of claim 16, wherein the dopant-rich layer is a substantially pure n-type or p-type impurity layer, with substantially no other elements other than the n-type or p-type impurity therein.

18. The method of claim 16, wherein the step of forming the dopant-rich layer comprises a plasma ion assisted deposition.

* * * * *